(12) United States Patent
Papandreou et al.

(10) Patent No.: US 10,937,512 B2
(45) Date of Patent: Mar. 2, 2021

(54) MANAGING PROGRAMMING ERRORS IN NAND FLASH MEMORY

(71) Applicant: International Business Machines Corporation, Armonk, NY (US)

(72) Inventors: Nikolaos Papandreou, Thalwil (CH); Thomas Mittelholzer, Zurich (CH); Roman Alexander Pletka, Uster (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/253,874

(22) Filed: Jan. 22, 2019

(65) Prior Publication Data

US 2020/0234780 A1 Jul. 23, 2020

(51) Int. Cl.
  *G11C 16/08* (2006.01)
  *G11C 16/34* (2006.01)
  *G11C 16/26* (2006.01)

(52) U.S. Cl.
  CPC .......... *G11C 16/3431* (2013.01); *G11C 16/08* (2013.01); *G11C 16/26* (2013.01); *G11C 16/3463* (2013.01)

(58) Field of Classification Search
  None
  See application file for complete search history.

(56) References Cited

U.S. PATENT DOCUMENTS

| | | | |
|---|---|---|---|
| 7,839,687 B2 | 11/2010 | Dutta et al. | |
| 8,386,890 B2 | 2/2013 | Wezelenburg et al. | |
| 8,656,255 B1 | 2/2014 | Nemazie et al. | |
| 8,717,827 B1 | 5/2014 | Mehnert et al. | |
| 8,806,293 B2 | 8/2014 | Tiziani et al. | |
| 10,101,931 B1* | 10/2018 | Camp | G06F 3/0619 |
| 2009/0310421 A1* | 12/2009 | Cernea | G11C 11/5628 365/185.19 |
| 2011/0310666 A1 | 12/2011 | Miida et al. | |
| 2016/0034351 A1 | 2/2016 | Michael | |
| 2017/0371744 A1* | 12/2017 | Sehgal | G06F 11/1068 |

OTHER PUBLICATIONS

Shi, X., et al., "Program Error Rate-based Wear Leveling for NAND Flash Memory", Design, Automation and Test in Europe (Date 2018), Mar. 19-23, 2018, pp. 1241-1246.*

(Continued)

*Primary Examiner* — Muna A Techane (74) *Attorney, Agent, or Firm* — Scully, Scott, Murphy & Presser, P.C.; Daniel P. Morris (57) ABSTRACT

A method of managing programming errors in a multilevel NAND flash memory is provided. The multilevel NAND flash memory uses a two-pass programming algorithm—e.g., a first programming pass and a second programming pass—for programming a memory block being organized in pages, sharing a word line. The method comprises performing the first programming pass for at least one memory page, reading the at least one memory page between the first programming pass and the second programming pass, determining an error count value for the at least one programmed memory page, and responsive to determining that the error count value is below a threshold value, performing the second programming pass with active data.

20 Claims, 7 Drawing Sheets

(56) References Cited

OTHER PUBLICATIONS

Guo, J., et al., "Data-Pattern-Aware Error Prevention Technique to Improve System Reliability", IEEE Transactions on /ery Large Scale Integration (VLSI) Systems, Apr. 2017, pp. 1433-1443, vol. 25, No. 4.*

Parnell, T., et al, "Modelling of the Threshold Voltage Distributions of Sub-20nm NAND Flash Memory", Globecom 2014—Symposium on Selected Areas in Communications: GC14 SAC Data Storage, Dec. 2014, pp. 2351-2356.*

Papandreou, N., et al., "Effect of Read Disturb on Incomplete Blocks in MLC NAND Flash Arrays", IEEE International Memory Workshop (IMW) 2016, May 15-18, 2016,4 pages.*

Guo, J., et al., "Data-Pattern-Aware Error Prevention Technique to Improve System Reliability", IEEE Transactions on Very Large Scale Integration (VLSI) Systems, Apr. 2017, pp. 1433-1443, vol. 25, No. 4.

Cai, Y., et al., "Vulnerabilities in MLC NAND Flash Memory Programming: Experimental Analysis, Exploits, and Mitigation Techniques", 2017 IEEE International Symposium on High Performance Computer Architecture, Feb. 4-8, 2017, pp. 49-60.

* cited by examiner

| SLC | 1 bit/cell | b0 | lower page contains the b0 of all cells | | | |
|---|---|---|---|---|---|---|
| MLC | 2 bits/cell | b1b0 | lower page contains the b0 of all cells | upper page contains the b1 of all cells | | |
| TLC | 3 bits/cell | b2b1 b0 | lower page contains the b0 of all cells | upper page contains the b1 of all cells | extra page contains the b2 of all cells | |
| QLC | 4 bits/cell | b3b2 b1b0 | lower page contains the b0 of all cells | upper page contains the b1 of all cells | extra page contains the b2 of all cells | top page contains the b3 of all cells |

MANAGING PROGRAMMING ERRORS IN NAND FLASH MEMORY

BACKGROUND

The present disclosure relates generally to a method for managing of programming of NAND flash memory devices, and more specifically, to a computer-implemented method for managing programming errors in a multilevel NAND flash memory, i.e., MLC, TLC or QLC NAND flash memory, that employs a multi-pass programming scheme. The present disclosure relates further to a related controller for managing programming errors in a multilevel NAND flash memory, and a computer program product.

Enterprise storage capacity requirements are growing steadily. At the same time, prices for flash storage units—e.g., SSDs (solid-state drive)—have decreased significantly in comparison to hard disk drive storage systems so that the industry demand for NAND flash-based memory has increased significantly. The cell density of such NAND flash memories is also ever-increasing and the number of bits that can be stored per memory cell is also ever increasing—e.g., after MLC (multi-level cell—for two bits per cell only), TLC (triple-level cell) or QLC (quad-level cell), etc.

A NAND flash memory block is known to be organized in word lines and bit lines. Each word line addresses cells that are programmed or read simultaneously. In 3D block structures, each block is further organized in layers that comprise multiple word line layers. Multi-level NAND flash technology stores more than one bit per memory cell by programming the threshold voltage (VTH) of each cell to multiple discrete levels, e.g., in MLC NAND there are 4 discrete levels, in TLC NAND there are 8 discrete levels, in QLC NAND there are 16 discrete levels. In order to program the cells in a word line, the respective controller needs to provide the information to be stored in all cells across the word line. By this, a page is defined, i.e., the memory page is the minimum addressable unit that comprises the bit information of the same significance from all cells of a word line.

To program the cells of a multi-level NAND flash memory chip, the respective controller needs to provide the information for the multiple pages that share the particular word line, e.g., in MLC NAND (two distinct levels to be programmed), the controller needs to provide the lower page with least significant bits (LSB) of all cells related to the word line and the upper page with most significant bits (MSB). Typically, the different pages in the block are written based on a device-specific page programming order which may write data to a subsequent word line sequentially or in an interleaved way in an attempt to mitigate the cell-to-cell interference (CCI) effects caused when programming adjacent word lines, or adjacent layers in 3D NAND devices. Typically, the multiple VTH levels are not programmed at once, but in steps. Typically two steps are involved. The first step is an intermediate step in which the respective controller provides the data of a subset of the pages that share the same WL, e.g., the lower page in the case of MLC NAND, and thus an intermediate subset of the VTH levels is programmed In the second step, the controller provides the data of the remaining pages, e.g., the upper page in the case of MLC NAND, next the memory device performs an internal read operation to read the data of the pages programmed previously in the first step, e.g., the lower page in the case of MLC NAND, and finally the VTH levels of all cells in the WL are completed depending on the new data provided by the controller and the previously programmed data read by the chip.

A so-called two-pass, or two-step, programming process can help in designing a programming order that may minimize CCI; however, it is susceptible to read errors that may happen when the memory device performs an internal read of the data programmed in the first step, so that these errors may propagate to the programming of the final VTH levels in the second step. To minimize the probability of such read errors, the respective controller may need—depending on the memory device—to provide again in the second step the data of a subset of the pages programmed in the first step; however, such a requirement has an increased buffering overhead for the controller.

In TLC and QLC NAND flash memory devices, the two-step programming process—may be much more susceptible to programming errors since more than two intermediate levels may be generated in the first programming step and thus, the read errors during the second programming step may happen much more frequently and at a higher rate.

However, none of the known documents describe an elegant way to address the problem of managing programming errors in NAND flash memory devices, including MLC, TLC and QLC NAND devices that employ a two-pass programming scheme, without the overhead of extra data buffers in the respective NAND flash controller or without the requirement to change reference chip voltages, e.g. read voltages used by the chip during the first programming pass, which relates to extra calibration overhead. Moreover, the 2-pass programming errors propagate from the first programming steps to the second programming step and contribute to extra bit errors.

However, there may be a need to overcome the requirements of just mentioned extra buffer or calibration overhead and to maintain a management of the 2-pass programming errors by monitoring the number of bit errors that may happen from the first programming steps to the second programming step and depending on the number of bit errors determining whether to complete the second programming step with user data or with synthetic data or whether to skip the second programming step.

SUMMARY

According to one aspect of the present invention, a computer-implemented method for managing programming errors in a multilevel NAND flash memory may be provided. The multilevel NAND flash memory may perform a two-pass programming algorithm for programming a memory block. The memory block may be organized in pages. The two-pass program algorithm may comprise a first programming pass and a second programming pass over the memory pages that share a word line. The method may comprise performing the first programming pass for at least one memory page, reading the at least one memory page between the first programming pass and the second programming pass, and determining an error count value for the at least one programmed memory page. Upon determining that the error count value is below a threshold value—in particular, an error threshold value—the method may comprise performing the second programming pass with active data.

According to another aspect of the present invention, a controller for managing programming errors in a multilevel NAND flash memory may be provided. The multilevel NAND flash memory may use a two-pass programming algorithm for programming a memory block, the memory block being organized in pages. The two-pass programming algorithm may comprise a first programming pass and a second programming pass over the memory pages that share a word line. The controller may comprise a first programming unit adapted for performing the first programming pass for at least one memory page, a reading unit adapted for reading the at least one memory page between the first programming pass and the second programming pass, and a determination module adapted for determining an error count value for the at least one programmed memory page.

The determination module may also be adapted for: upon determining that the error count value is below a threshold value, performing the second programming pass for a programming with active data.

The proposed computer-implemented method for managing programming errors in a multilevel NAND flash memory may offer multiple advantages and technical effects:

Known disadvantages of addressing issues in the context of a two-pass NAND flash memory programming may elegantly be overcome. In particular, it may not be required to keep extra data buffers to store increased amount of pages so that the respective controller provides in the second programming step part or all the data programmed in the first step in an attempt to mitigate any errors that may happen if the memory device reads internally the data of the first programming step.

Further, it may not be required to perform calibration of the reference read voltages used by the memory device internally the data of the first programming step. These reference voltages may not be available to the respective NAND flash controller or may result in extra calibration overhead.

In the following, additional embodiments of the inventive concept—applicable to the method as well as to the controller—will be described:

According to one optional embodiment, the method may also comprise upon determining that the error count value is not below the threshold value, performing the second programming pass with non-active data for the remaining pages of the respective word lines, i.e., for pages not programmed in the first programming step. It may be noted that non-active data may be dummy data or predefined data.

According to one permissive embodiment of the method, the non-active data may be random bit patterns. This may preserve the requirement for randomness and cell-to-cell interference minimization. Random data may easily be generated within a memory controller.

According to one alternative embodiment, the method may also comprise upon determining that the error count value is not below the threshold value, skipping the second programming pass.

According to one further embodiment, the method may also comprise applying the proposed method periodically every predetermined number of programming cycles of a memory block. Thus, the small overhead related to determining an error count may appear for a smaller number of programming cycles. The predetermined number may relate to, e.g., 100 programming cycles, 500 programming cycles, or any other suitable number of programming cycles.

If during the application of the proposed method, it is determined that one or more pages in a block will be programmed with none-active data or their programming will be skipped in the second programming step, then those pages may be marked accordingly using appropriate definition of metadata tables. Therefore, before programming the pages in a block, the controller first may determine whether a page will be programmed with active data, or will be programmed with none-active data, or its programming will be skipped in the second programming step by reading the respective metadata. Upon determination that one or more pages in a block will be programmed with none-active data or their programming will be skipped in the second programming step, those pages will continue to be programmed with none-active data or their programming will be skipped in the second programming step, either for all the program cycles of the respective block until the block is retired in its end of life, or for the next program cycles until the proposed method may be applied again after the predetermined number of programming cycles, when a new decision will be taken for all pages in the block.

According to a further alternative or an additionally advantageous embodiment, the method may also comprise applying the proposed method after a detection of a demand trigger signal. Such a trigger signal may be generated if it turns out that the wear level of the device may have increased and that, e.g., a threshold value related to number of bit errors in a page or in an ECC code-word is exceeded.

According to one permissive embodiment of the method, the demand trigger may be set upon a read scrubbing trigger event, i.e., by periodically reading the pages in the programmed blocks of the memory device and determining the maximum or the average page error count in the blocks, and thus issuing a trigger event if the respective error count value has exceeded a threshold value.

According to one optional embodiment of the method, the reading of the at least one memory page between the first programming pass and the second programming pass may be performed right after the first programming pass. In another alternative and closely related embodiment of the method, the reading of the at least one memory page between the first programming pass and the second programming pass may be performed right before the second programming pass. Which of the two versions may be advantageous may depend on the NAND flash memory type, the wear level of the device, production variances of the device and other parameters. The method may also be adapted for switching between the two alternative described embodiments.

According to one embodiment of the method, the multilevel NAND flash memory may comprise memory cells capable of storing at least two bits per memory cell. I.e., in case of a TLC device, three bits per memory cell may be storable; and in case of a QLC device, four bits per memory cell may be storable. The concept may be extended to five bits per cell, or even more. The fundamental concept described here may thus also be used for higher level cell devices. Moreover, the concept may be applicable to both 2D and 3D NAND flash devices that employ an MLC or TLC or QLC or higher level cell technology which encompasses a multiple step program process, e.g., a 2-step program process.

Furthermore, embodiments may take the form of a related computer program product, accessible from a computer-usable or computer-readable medium providing program code for use, by, or in connection, with a computer or any instruction execution system. For the purpose of this description, a computer-usable or computer-readable medium may be any apparatus that may contain means for storing, communicating, propagating or transporting the program for use, by, or in connection, with the instruction execution system, apparatus, or device.

BRIEF DESCRIPTION OF THE SEVERAL VIEWS OF THE DRAWINGS

It should be noted that embodiments of the invention are described with reference to different subject-matters. In particular, some embodiments are described with reference to method type claims, whereas other embodiments are described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be disclosed within this document.

The aspects defined above, and further aspects of the present invention, are apparent from the examples of embodiment to be described hereinafter and are explained with reference to the examples of embodiments, but to which the invention is not limited.

Preferred embodiments of the invention will be described, by way of example only, and with reference to the following drawings.

DETAILED DESCRIPTION

In the context of this description, the following conventions, terms and/or expressions may be used:

The term 'programming errors' may denote that a bit in a memory cell has not been programmed to a logical value as intended. Thus, a bit programming error happens during the programming process of a particular page of a 3D NAND flash memory device. More specifically, the term, 'two-pass programming errors' or 'two-step programming errors' may denote that a bit in a memory cell has not been programmed to a logical value as intended due to errors that happen during the 2-pass, or 2-step, process of programming the related memory page or pages.

The term 'multilevel NAND flash memory' may denote a memory device allowing more bits per memory cells. In the case of 3D NAND flash memory devices two, three or four bits may currently be stored per memory cell. However, it can be expected that more than four bits may be storable in one memory cell. The proposed concept may also apply to those NAND flash memory devices allowing more than four storable bits per memory cell.

The term 'two-pass programming algorithm' may denote that in a multilevel NAND flash memory device not all bits—and thus statuses—of a memory cell may be programmed in one pass but in two—passes, or steps of programming the respective pages related to the word line that memory cell belongs to. It may be noted then other multilevel NAND flash memory devices may even use three-pass or more than 3 pass programming algorithms Although the term two-pass programming algorithm is used to describe various alternative embodiments herein, one skilled in the art can easily apply the same methods to three-pass or more than 3 pass programming algorithms such that the next programming step may be dependent on any prior programming pass of the same wordline without departing from the main idea of the presented invention. Generally, the programming algorithm is performed according to the device specifications.

The term 'memory block' may denote a group of memory pages of a NAND flash memory device being addressable for an operation. It is well known in the art that in NAND flash devices data are programmed on a page basis and are erased on a block basis.

The term 'page' or 'memory page' may denote a plurality of memory cells organized as a memory page, e.g., a NAND flash memory page. There may also be shared memory pages belonging to one word line in case of technologies which are able to store multiple bits per cell. Typical memory page sizes are 2 kB, 4 kB 8 kB or 16 kB. However, with increasing cell density also larger page sizes may be possible. The proposed concept may be applicable to any memory page size.

The term 'first programming pass' may denote a first programming operation for a programming of a set of shared pages that belong to the same word-line of a NAND flash memory block. The programming of a NAND flash memory block may be divided into steps following a device-specific page programming order.

The term 'second programming pass' may denote a second programming operation for a programming of a set of shared pages that belong to the same word-line of a NAND flash memory block. This second programming pass or programming step may be dependent on the first programming pass or programming step to correctly program all bits in a memory cell. In between the first and the second programming pass certain actions, like a determination of an error count of the programming of the first pass, may be performed. Known programming sequences of 3D NAND flash memory devices are denoted as 2-4 (for MLC devices), 2-8 or 2-4-8 (for TLC devices), or 8-16 (for QLC devices), however other sequences are also possible.

The term 'word line' may denote an addressing line in a 3D NAND flash memory addressing memory cells. A word line may comprise of memory cells that are able to store more than 1 bit per cell. Each word line may comprise of multiple pages that are related to the different bits stored in the memory cells of the word line.

The term 'at least one memory page' may denote in the context of this application that also more memory pages may be related to the first programming pass. In an MLC device with two bits per memory cell, actually only the lower page may be related. However, in a TLC device with three bits per memory cell, the lower and upper pages may be related; and in case of a QLC device with four bits per memory cell, the lower, upper and extra pages may be related to the first programming pass. However, in general, the number and type of pages related to the first programming pass may be defined according to the device specifications. The same general principle may be applicable also for NAND flash memory devices allowing more than four bits per memory cell.

The term 'error count value' may denote a counter value that may be determined after the memory cells have been programmed in the first programming pass or any subsequent programming pass. The actually written bits may be different if compared to the intended data pattern to be stored in the memory cells during the first programming pass due to wear or other disturbing effects. The error count value may be compared to a threshold value, i.e., error threshold value.

The term 'active data' may denote data coming from outside a memory controller and which are intended to be stored in the 3D NAND flash memory device. The active data may be system dependent data, operating system dependent data or user process dependent data. Active data should be differentiated to memory controller generated non-active data. Such data may be synthetically generated—e.g., random data—or they may be already used data, e.g., from a memory page belonging to the same group of memory cells where the memory pages was programmed in the first programming pass. E.g., top page data of a QLC device may be a function of the extra page data if the error count value of the pages being written during the first programming pass—e.g., the lower page, the upper page and the extra page—may be above a predefined threshold value.

The term 'demand trigger signal' may denote a signal being generated during the operation of the 3D NAND flash memory device. It may signal a predetermined number of program/erase cycles, maybe related to a wear level of the memory device, or maybe triggered by other conditions indicating that the 3D NAND flash memory device, or certain memory pages or blocks may not perform—i.e., being programmable or readable—as specified or expected.

The term 'read scrubbing trigger event' may denote an event being generated upon periodically reading the pages in the programmed blocks of the NAND flash memory device and determining the maximum or the average page error count in the blocks, and further issuing a trigger event if the respective error count value has exceeded a threshold value.

In the following, a detailed description of the figures will be given. All instructions in the figures are schematic. Firstly, a block diagram of an embodiment of the inventive computer-implemented method for managing programming errors in a NAND flash memory is given. Afterwards, further embodiments, as well as embodiments of the controller for managing programming errors in a NAND flash memory, will be described.

Figure 1:
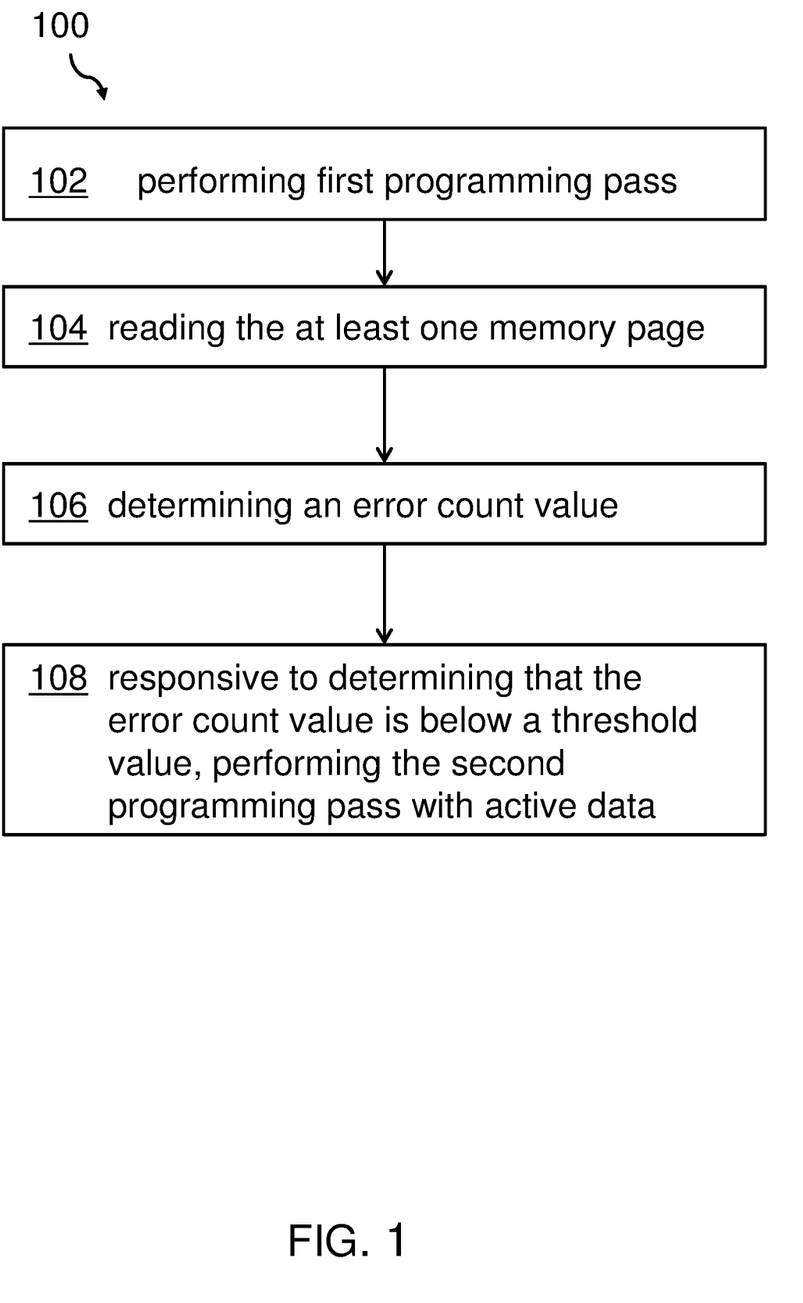
FIG. 1 shows a block diagram of an embodiment of the inventive computer-implemented method for managing programming errors in a multilevel NAND flash memory.

FIG. 1 shows a block diagram of an embodiment of the method 100 for managing programming errors in a NAND flash memory. The NAND flash memory uses here a two-pass programming algorithm for programming—a memory block. The memory block is typically organized in pages and the two-pass program algorithm comprises a first programming pass and a second programming pass over the memory pages that share a word line. The method comprises performing, 102, the first programming pass for at least one memory page. The number and type of pages programmed in the first programming pass depend on the NAND flash memory device. In an MLC type device, this at least one page may be the lower page. The respective upper page that shares the same word line is programmed in the second programming pass. In case of a QLC type device, the at least one memory page may be the lower, the upper, and the extra pages that share the same word line altogether. The respective top page that shares the same word line is programmed in the second programming pass.

The method 100 comprises further reading, 104, the at least one memory page programmed after the first programming pass. In an MLC type device, the lower page is read. In case of a QLC type device, the lower, the upper, and the extra pages are read. The method 100 comprises further determining, 106, an error count value—in particular, a read error count—for the at least one programmed memory page. In an MLC type device, the error count of the lower page is determined. In a QLC type device, the error counts of the lower, upper, and extra pages are determined. In addition, for a QLC type of device, the aggregate error count of the lower, upper, and extra pages may be determined.

The method 100 comprises, responsive to determining that the error count value is below a threshold value—in particular error threshold value—performing, 108, the second programming pass with active data. Thus, all pages and all levels in the cells are used for user data.

Figure 2:
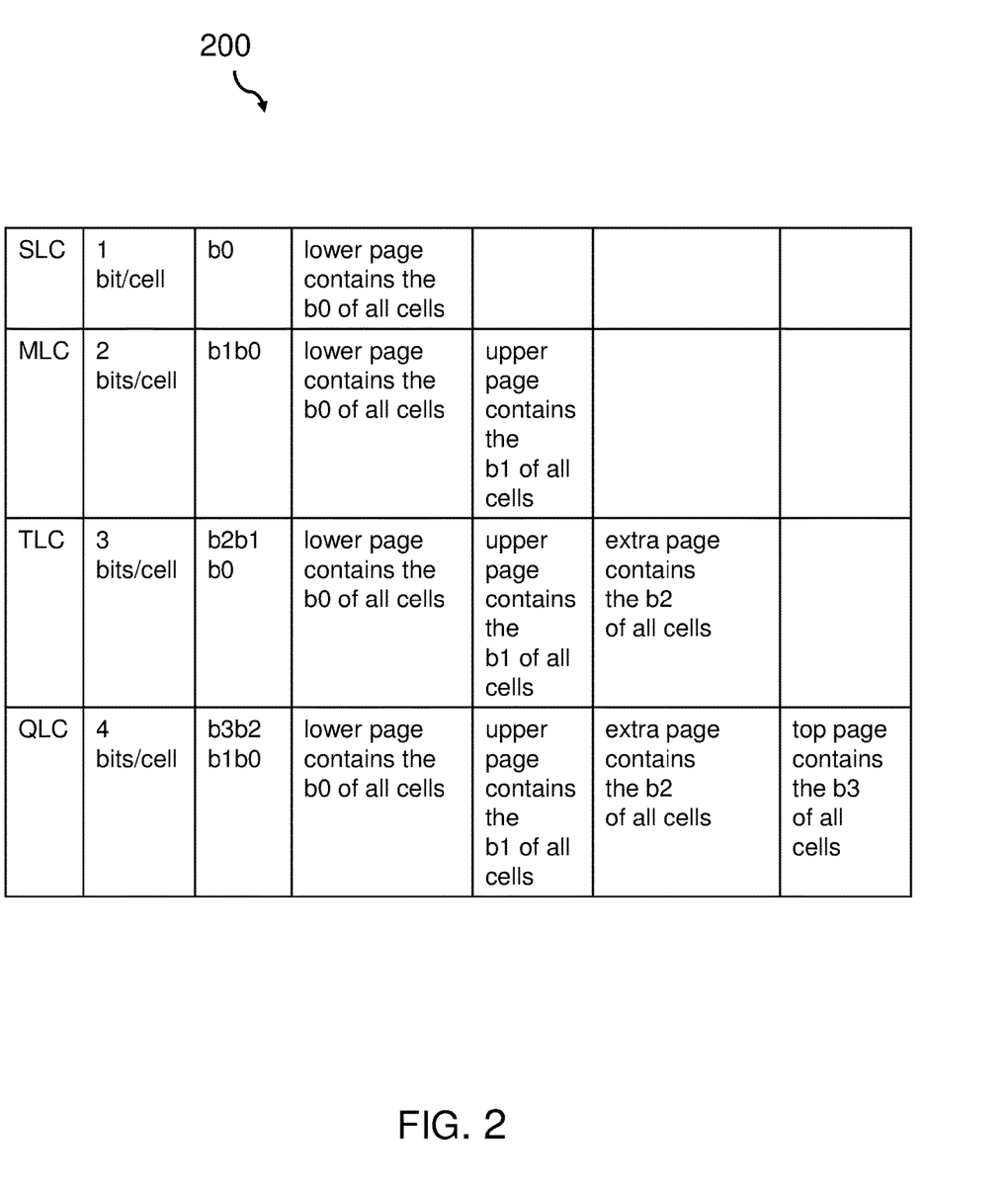
FIG. 2 shows a table of different type of memory cells allowing more than one bit per cell.

FIG. 2 shows a table 200 of different type of memory cells allowing more than one bit per cell. In particular, the differences between SLC, MLC, TLC and QLC type devices are shown in an overview form.

In the third column of the table 200 the different bits—in particular bit b0, bit b1, bit b2 and bit b3—are named relating to the different types of cells and b0 is the least significant bit. The $4^{th}$, $5^{th}$, $6^{th}$ and $7^{th}$ columns illustrate the different pages used with different types of devices (SLC, MLC, TLC, and QLC). In particular, an MLC device can store data in the lower and the upper page, a TLC device can store data in the lower, the upper and the extra page, and a QLC device can store data in the lower, the upper, the extra and the top page. It may be noted that the name of a particular page may be dependent on the NAND flash vendor and different vendors may use different names for the different pages used to store the b0, b1, b2 and b3 data.

Figure 3:
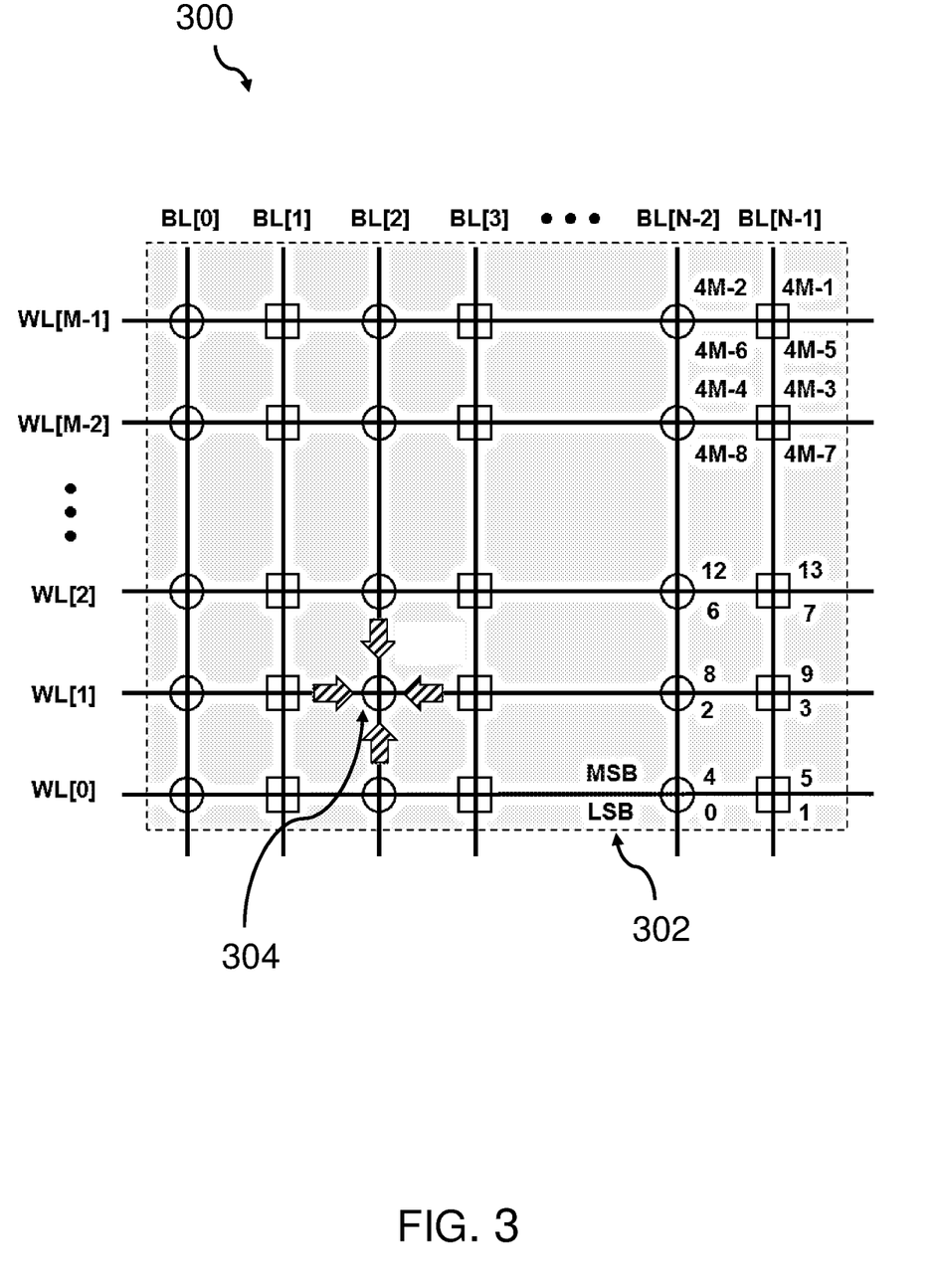
FIG. 3 shows a block diagram of an embodiment of an exemplary page programming order in an MLC 2D NAND flash device.

FIG. 3 shows a block diagram 300 of an embodiment of an exemplary page programming order in an MLC 2D NAND flash device. In this case, two bits per memory cell are possible. Horizontal lines show the word lines, denoted as WL (from 0 to M−1), and the vertical lines are the bitlines, denoted as BL (from 0 to N−1), for a device with a block size of N×M cells. Each word line contains cells that are programmed or read simultaneously. In 3D block structures, the block is organized in layers that consist of multiple word lines. As can be seen easily, if a word line is activated for writing, the controller needs to provide the information to be stored in all cells across the word line, i.e., for all bitlines simultaneously. One may call the memory page the minimum addressable unit that contains the bit information of the same significance from all cells of a word line.

In the example shown—of the MLC 2D NAND flash memory device—the lower/upper pages comprise the LSB/MSB (least significant bit/most significant bit) of each word line, respectively. As mentioned above, the word line can select all the cells (across all bitlines) at once. Thus, in this example of an MLC NAND device, there exists a pair of a lower and an upper page that share the same word line as indicated by the MSB/LSB denotation of WL[0] (compare 302).

Reference may also be made to the cell 304, which may experience a cell-to-cell (CCI) interference when adjacent cells in the same or neighboring WLs, and in the same or neighboring layers in the case of 3D NAND, are being programmed. This represents an effect to be minimized.

Typically, the different pages in the block are written based on a device-specific programming order which may write data to subsequent word lines sequentially or in an interleaved way in an attempt to minimize the CCI caused when programming adjacent word lines. Typically, the multiple VTH levels for the different cells in the WL are not formed at once but in steps. In this example, two steps are involved. The first step is an intermediate step where only the lower page is programmed and thus two intermediate VTH levels are formed. In the second step, the upper page is programmed and the final four VTH levels are formed. The first step may relate to the first programming pass, and the second step may be related to the second programming pass.

Figure 4A:
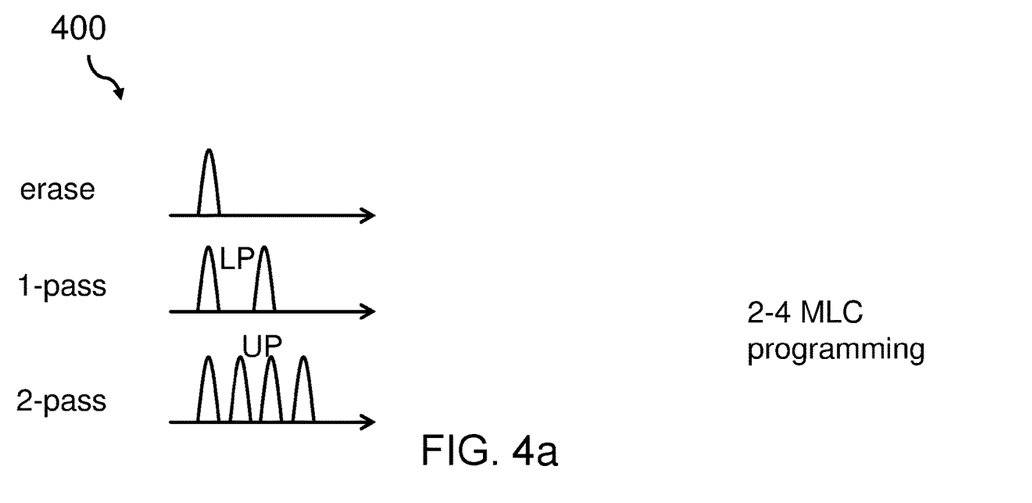
FIG. 4a, FIG. 4b, FIG. 4c show diagrams of different types of programming for different types of memory cells with more than one level per memory cell.
Figure 4B:
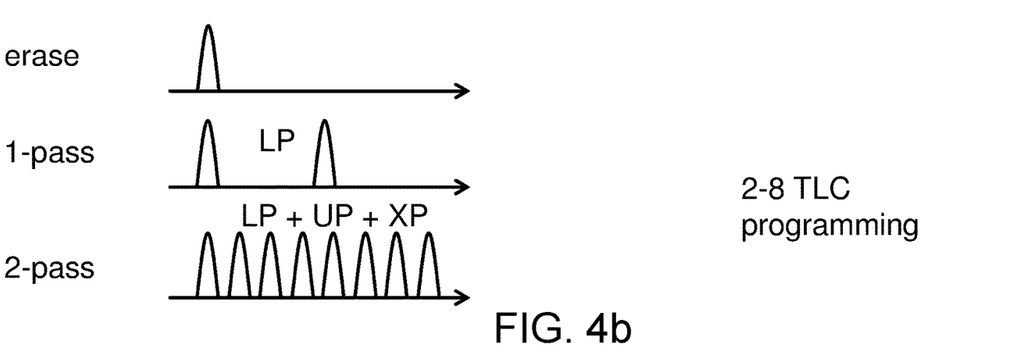
Figure 4C:
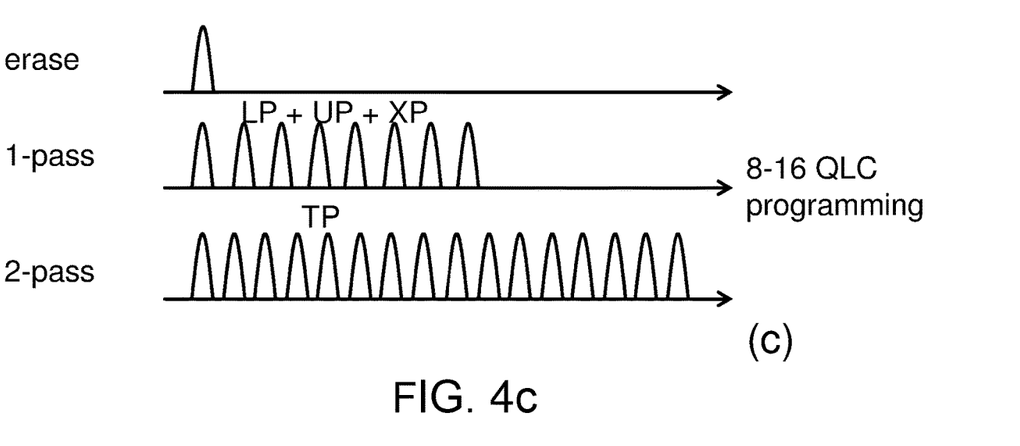

FIG. 4a, 4b, 4c, show diagrams of different types 400 of two-pass programming for different types of memory cells with more than one bit per memory cell. FIG. 4a relates to an MLC device, allowing two bits per memory cell. FIG. 4b relates to a TLC device, allowing three bits per memory cell and, FIG. 4c relates to a QLC device, allowing four bits per memory cell. Thus, an MLC device allows differentiating between four different statuses (00, 01, 10, 11), a TLC device allows differentiating between eight different statuses and, a QLC device allows differentiating between 16 statuses. Accordingly, different programming styles are used. For an MLC device, a 2-4 programming is used, meaning that in the first programming pass the respective memory controller provides the data of the lower page (LP) and two intermediate levels are programmed, while in the second programming pass the memory controller provides the data of the upper page (UP) and the final four levels are programmed. The programming style for a TLC is denoted as 2-8, meaning that in the first programming pass the respective memory controller provides the data of the lower page and two intermediate levels are programmed, while in the second programming pass the memory controller provides the data of the upper page and the extra page (XP) and the final eight levels are programmed Another program style for TLC, not shown, may be 4-8, meaning that in the first programming pass four intermediate levels are programmed, i.e., the respective memory controller provides the data for the lower page and upper page, while in the second programming pass the final eight levels are programmed, i.e., the controller provides the data for the remaining extra page.

The programming style for a QLC is typically denoted as 8-16 programming because in the first programming pass the respective memory controller provides the data of the lower, upper and extra pages and thus eight intermediate levels are programmed, while in the second programming pass the memory controller provides the data of the top page (TP) and the final sixteen levels are programmed Another program style for QLC, not shown, may be 2-8-16, meaning that there are three passes: in the first programming pass two intermediate levels are programmed, in the second programming pass eight intermediate levels are programmed, and in the third programming pass the final sixteen levels are formed.

Now, the two-pass program process can help in designing a programming order that minimizes cell-to-cell interference; however, it is susceptible to program errors that, if happened in the first step (i.e., the first programming pass), the errors may propagate to the second step (i.e., the second programming pass). Naturally, these errors happen before the second programming pass when the memory device performs an internal read operation to determine the data written in the first programming pass, so that it can properly finalize the VTH distributions based on the new data provided by the controller in the second programming pass. Now, in order to avoid extra overhead, the controller typically does not provide again the data of the first programming pass together with the new data in the second programming pass.

According to the here proposed concept—for a QLC device—before the second programming pass is executed, the controller reads the lower page, upper page, and extra page, which are in an intermediate TLC state, and applies ECC to count the number of read errors of those pages. These errors reflect errors that will appear in the device internal read operation as well and will be propagated as program errors in the second programming pass. The proactive read of the three pages can take place soon after the completion of the first programming pass or before the beginning of the second programming pass, or, alternatively, in both cases. There may be a time difference between the first and the second programming pass, or there may be a number of read requests to the pages programmed after the first programming pass and before writing new data to the remaining pages in the second programming pass, depending on the actual workload.

Depending on the time when the proactive read is performed, different error sources may be addressed: a reading soon after the first programming pass may capture the effect of a permanent wear of the device, e.g., due to a permanent cycling; a reading before the second programming pass may capture additional effects, e.g., a read disturb or retention effects.

The sum of the read errors from the pages programmed in the first pass before proceeding to the second programming pass gives a direct indication about how many programming errors will most likely take place in the second programming pass.

Using an error count threshold value, a decision can be made to take one of the following actions when the threshold value is reached or exceeded. It may be decided not to program the top page, i.e., leave the word line in the intermediate TLC mode, or it may be decided to program the top page to finalize the 16 levels of the QLC device, however, with non-user data. The non-user data may comprise a specific bit pattern that depends on the data programmed in the first programming pass which may result in only a subset of the final sixteen total distributions, or the non-user data may be dummy data, i.e., random or known scrambled data patterns.

Or, alternatively, it may be decided to program the top page with user data, but perform a verification read afterwards. Thus, if the error count on the verification read is too high, a decision to relocate the effective top page, or all the pages that share the respective WL, can easily be made.

Furthermore, the error count threshold may be adapted depending on a wear level of the device, i.e., the number of p/e (program/erase) cycles, number of read cycles, retention history, etc. The higher the wear of the device, the less program errors can be accepted to propagate after the first programming pass. The error count threshold may also be global per die or per block or per group of blocks with the same or similar wear history.

As mentioned above, the determining of the collective error read count of all pages for a given word line after the first programming pass in order to decide how to program the remaining pages during the second programming step can be applied periodically or upon a specific request of a request signal. E.g., it may be performed after, e.g., 500 cycles, when the target block is being filled with data to capture the permanent wear of the block which will be reflected in increased errors after the first programming pass.

In another embodiment, a block may be marked to perform an error count check. E.g., a background read scrubber may be used to mark a block when an error count exceeds a related threshold. In such a case, the error count check may be performed on the marked block, the next time the block is going to be written with user data or, the programming can be performed in the background using pseudorandom synthetic data.

Additionally, the concept of an error count check after the first programming pass may be applied to a subset of pages in a memory block, or a subset of layers in 3D NAND blocks. These pages or layers may be defined by laboratory data or may be calculated on the fly by statistics. These pages or layers may be the pages or layers in the block that show the highest error count and therefore, they are more critical to be checked for errors after the first programming pass. The general underlying concept will be described in the next figure.

Figure 5:
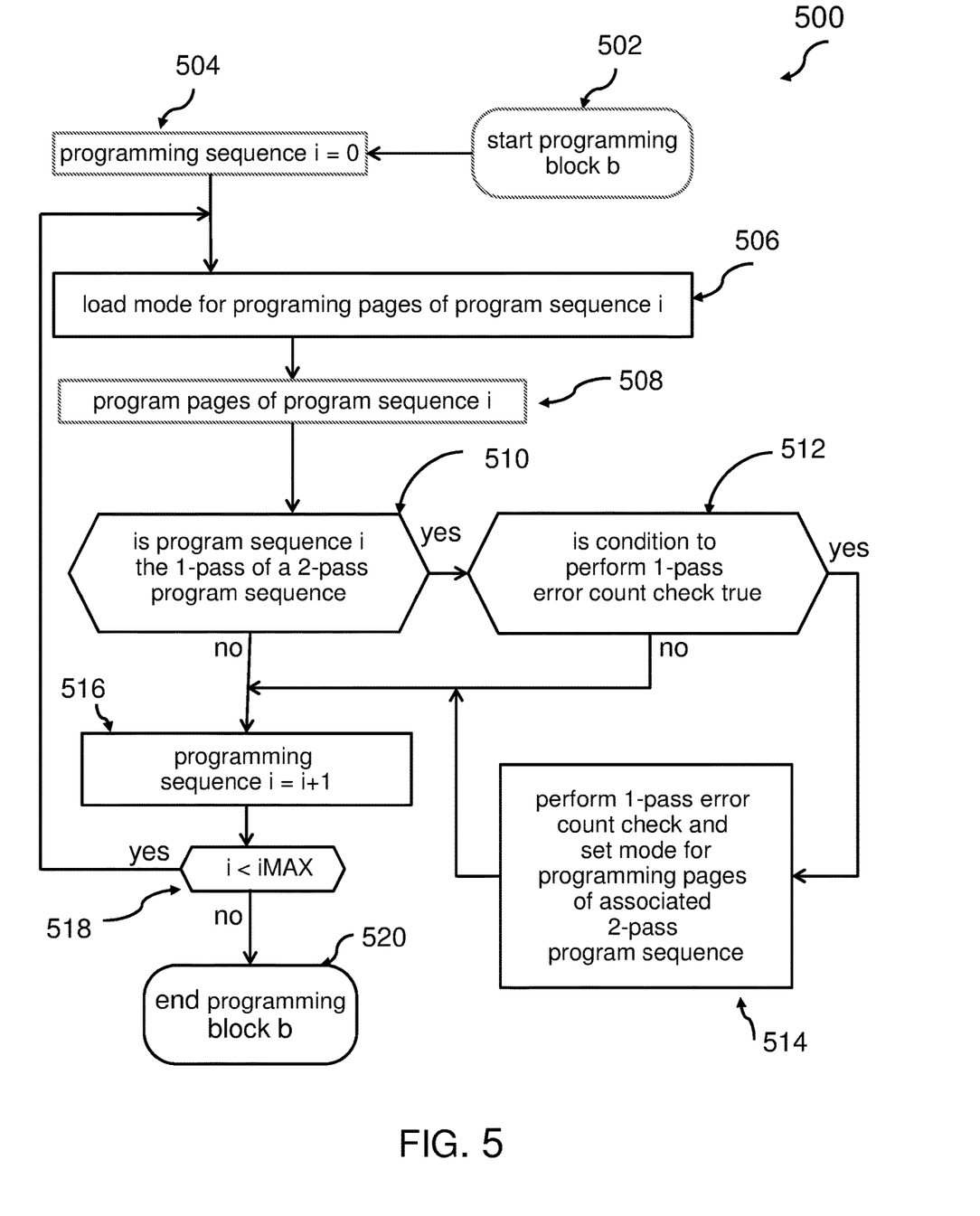
FIG. 5 shows a flowchart relating to a possible implementation of the proposed concept.

FIG. 5 shows a flowchart 500 relating to a possible implementation of the proposed concept. When starting, 502, programming a block b, the programming sequence i is set, 504, to zero. As an example, the description relates to a QLC device. However, an adoption to devices with less or even more bits per cell can be made.

The controller mode for programming the pages of the programming sequence i is loaded, 506. Then, the pages of the programming sequence i will be programmed, 508. It may be noted that the mode determines whether to skip the programming sequence i or not, whether to program the pages of the sequence i with user data or synthetic data, etc.

Next, in the determination step 510, it is determined whether the programming sequence i relates to the first programming pass of a two-pass programming In case of "yes", it is determined, 512, if the condition to perform the read error count determination is true. If that is the case— case "yes"—the first programming pass read error count check is performed, 514, and the mode is set for a programming of pages of an associated two-pass programming sequence, then the method continues with step 516 of increasing the programming sequence to i+1.

The condition in 512 may be to perform the 1-pass read error determination every N cycles (e.g., 500 cycles), and/or whether the pages of sequence i are in the list of pages to perform the error count check, and/or whether the block has been previously marked to perform an error count check, etc.

In more detail: the error count check is performed according to: read the pages of the first programming pass sequence i, calculate the collective error count and decide whether to skip the associated two-pass sequence or not, whether to program the pages of the associated two-pass sequence with user or synthetic data, etc.

In case the condition is not met in determination step 512—case "no"—the process continues to the step 516. Also in case of a "no" during the determination 510 whether the programming sequence i is a 1-pass of a 2-pass program sequence, step 516 is executed next.

It may be understood that the program sequence involves programming one or more pages using a one-pass or two-pass page program command sequence according to the device page program order.

In a next determination 518, it is determined whether the programming sequence i has reached its maximum. If that is not the case, the process loops back to loading the mode for the programming of pages of the updated program sequence i, 506. If, instead, the maximum count for i is reached, the programming of the block b ends, 520.

Figure 6:
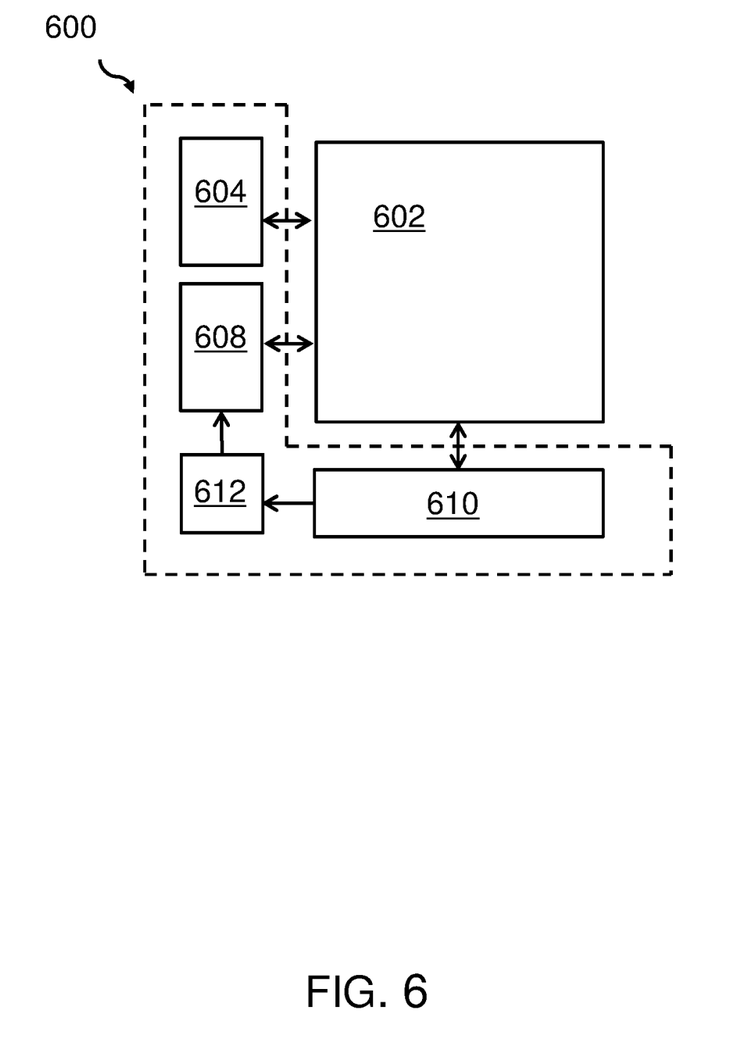
FIG. 6 shows a block diagram of a controller for managing programming errors in a multilevel NAND flash memory.

FIG. 6 shows a block diagram of a controller 600 for managing programming errors in a 3D NAND flash memory 602. As always in the context of this document, the 3D NAND flash memory uses a two-pass programming algorithm for programming pages of a memory block to multiple levels. Also here, the two-pass program algorithm comprises a first programming pass and a second programming pass over the memory pages that share a word line. The controller—surrounded by dashed lines—comprises a first programming unit 604 adapted for performing the first programming pass for at least one memory page, a reading unit 610 adapted for reading the at least one memory page between the first programming pass and the second programming pass, and a determination module 612 adapted for determining an error count value for the at least one programmed memory page.

Thereby, the determination module 612 is also adapted for: upon determining that the error count value is below a threshold value, performing the second programming pass— potentially by a second programming unit 608—for a programming with active data.

Figure 7:
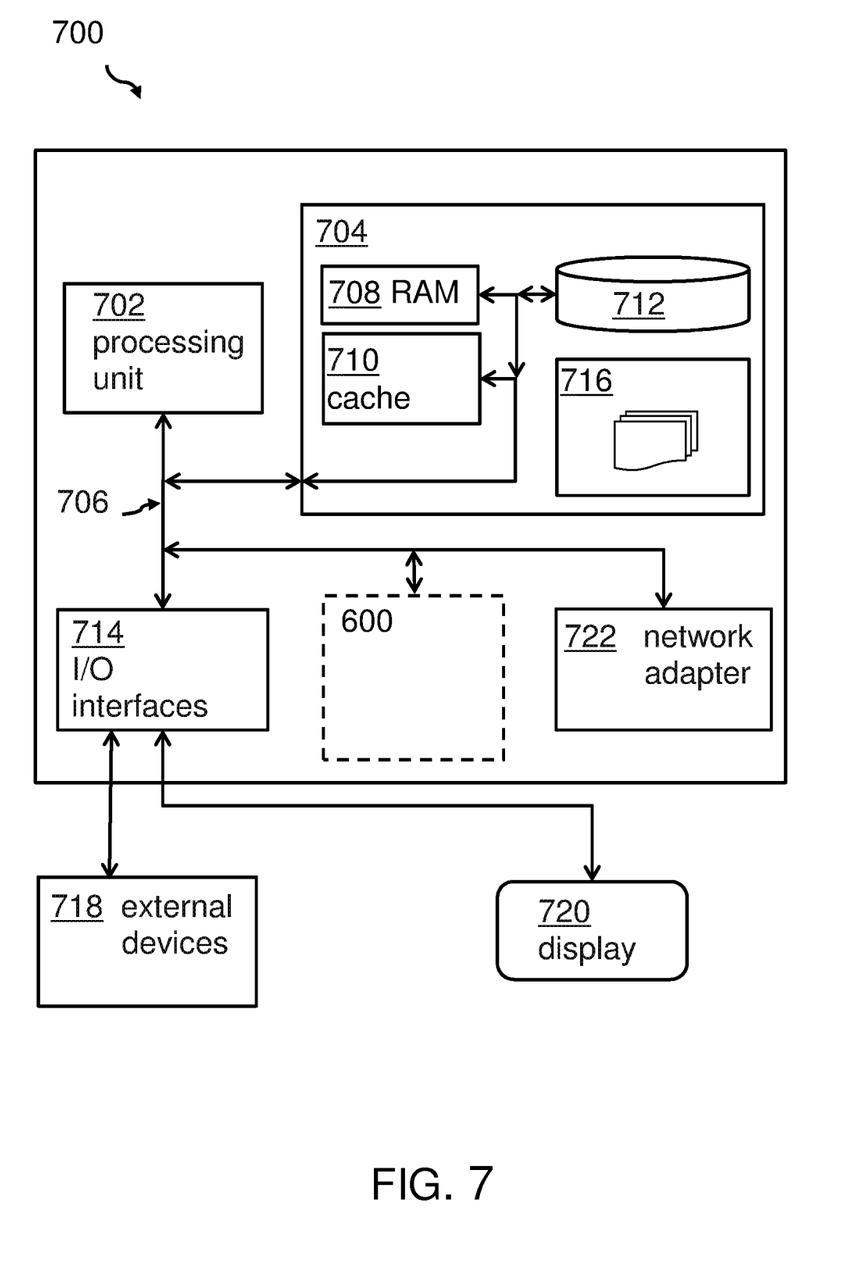
FIG. 7 shows an embodiment of a computing system comprising the controller according to FIG. 6.

Embodiments of the invention may be implemented together with virtually any type of computer, regardless of the platform being suitable for storing and/or executing program code. FIG. 7 shows, as an example, a computing system 700 suitable for executing program code or working in collaboration with a memory controller related to the proposed method.

The computing system 700 is only one example of a suitable computer system, and is not intended to suggest any limitation as to the scope of use or functionality of embodiments of the invention described herein, regardless, whether the computer system 700 is capable of being implemented and/or performing any of the functionality set forth hereinabove. In the computer system 700, there are components, which are operational with numerous other general purpose or special purpose computing system environments or configurations. Examples of well-known computing systems, environments, and/or configurations that may be suitable for use with computer system/server 700 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like. Computer system/server 700 may be described in the general context of computer system-executable instructions, such as program modules, being executed by a computer system 700. Generally, program modules may include routines, programs, objects, components, logic, data structures, and so on that perform particular tasks or implement particular abstract data types. Computer system/server 700 may be practiced in distributed cloud computing environments where tasks are performed by remote processing devices that are linked through a communications network. In a distributed cloud computing environment, program modules may be located in both, local and remote computer system storage media, including memory storage devices.

As shown in the figure, computer system/server 700 is shown in the form of a general-purpose computing device. The components of computer system/server 700 may include, but are not limited to, one or more processors or processing units 702, a system memory 704, and a bus 706 that couple various system components including system memory 704 to the processor 702. Bus 706 represents one or more of any of several types of bus structures, including a memory bus or memory controller, a peripheral bus, an accelerated graphics port, and a processor or local bus using any of a variety of bus architectures. By way of example, and not limiting, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus. Computer system/server 700 typically includes a variety of computer system readable media. Such media may be any available media that is accessible by computer system/server 700, and it includes both, volatile and non-volatile media, removable and non-removable media.

The system memory 704 may include computer system readable media in the form of volatile memory, such as random access memory (RAM) 708 and/or cache memory 710. Computer system/server 700 may further include other removable/non-removable, volatile/non-volatile computer system storage media. By way of example only, a storage system 712 may be provided for reading from and writing to a non-removable, non-volatile magnetic media (not shown and typically called a 'hard drive'). Although not shown, a magnetic disk drive for reading from and writing to a removable, non-volatile magnetic disk (e.g., a 'floppy disk'), and an optical disk drive for reading from or writing to a removable, non-volatile optical disk such as a CD-ROM, DVD-ROM or other optical media may be provided. In such instances, each can be connected to bus 706 by one or more data media interfaces. As will be further depicted and described below, memory 704 may include at least one program product having a set (e.g., at least one) of program modules that are configured to carry out the functions of embodiments of the invention.

The program/utility, having a set (at least one) of program modules 716, may be stored in memory 704 by way of example, and not limiting, as well as an operating system, one or more application programs, other program modules, and program data. Each of the operating systems, one or more application programs, other program modules, and program data or some combination thereof, may include an implementation of a networking environment. Program modules 716 generally carry out the functions and/or methodologies of embodiments of the invention, as described herein.

The computer system/server 700 may also communicate with one or more external devices 718 such as a keyboard, a pointing device, a display 720, etc.; one or more devices that enable a user to interact with computer system/server 700; and/or any devices (e.g., network card, modem, etc.) that enable computer system/server 700 to communicate with one or more other computing devices. Such communication can occur via Input/Output (I/O) interfaces 714. Still yet, computer system/server 700 may communicate with one or more networks such as a local area network (LAN), a general wide area network (WAN), and/or a public network (e.g., the Internet) via network adapter 722. As depicted, network adapter 722 may communicate with the other components of computer system/server 700 via bus 706. It should be understood that, although not shown, other hardware and/or software components could be used in conjunction with computer system/server 700. Examples, include, but are not limited to: microcode, device drivers, redundant processing units, external disk drive arrays, RAID systems, tape drives, and data archival storage systems, etc.

Additionally, the controller 600 for managing programming errors in a multilevel NAND flash memory (here not shown) may be attached—eventually by a dedicated interface—to the bus system 706.

The descriptions of the various embodiments of the present invention have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

The present invention may be embodied as a system, a method, and/or a computer program product. The computer program product may include a computer readable storage medium (or media) having computer readable program instructions thereon for causing a processor to carry out aspects of the present invention.

The medium may be an electronic, magnetic, optical, electromagnetic, infrared or a semi-conductor system for a propagation medium. Examples of a computer-readable medium may include a semi-conductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W), DVD and Blu-Ray-Disk.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disk read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object-oriented programming language such as Smalltalk, C++ or the like, and conventional procedural programming languages, such as the "C" programming language or similar programming languages. The computer readable program instructions may execute entirely on the user's computer, partly on the user's computer as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatuses, or another device to cause a series of operational steps to be performed on the computer, other programmable apparatus or other device to produce a computer implemented process, such that the instructions which execute on the computer, other programmable apparatuses, or another device implement the functions/acts specified in the flowchart and/or block diagram block or blocks.

The flowcharts and/or block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or act or carry out combinations of special purpose hardware and computer instructions.

The terminology used herein is for the purpose of describing particular embodiments only and is not intended to limit the invention. As used herein, the singular forms "a", "an" and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present invention has been presented for purposes of illustration and description, but is not intended to be exhaustive or limited to the invention in the form disclosed. Many modifications and variations will be apparent to those of ordinary skills in the art without departing from the scope and spirit of the invention. The embodiments are chosen and described in order to best explain the principles of the invention and the practical application, and to enable others of ordinary skills in the art to understand the invention for various embodiments with various modifications, as are suited to the particular use contemplated.

What is claimed is:

1. A method for managing programming errors in a multilevel NAND flash memory, said multilevel NAND flash memory using a two-pass programming algorithm for programming a memory block, said memory block being organized in pages, wherein said two-pass program algorithm comprises a first programming pass and a second programming pass over said memory pages that share a word line, said method comprising:
   performing said first programming pass for at least one memory page;
   reading said at least one memory page between said first programming pass and said second programming pass;
   determining an error count value for said at least one programmed memory page; and
   responsive to determining that said error count value is not below said threshold value, performing said second programming pass with non-active data.

2. The method according to claim 1, wherein responsive to determining that said error count value is below a threshold value, performing said second programming pass with active data.

3. The method according to claim 2, wherein said non-active data are random bit patterns.

4. The method according to claim 1, wherein
responsive to determining that said error count value is not below said threshold value, skipping said second programming pass.

5. The method according to claim 1, also comprising: applying said method periodically every predetermined number of programming cycles of said memory block.

6. The method according to claim 1, also comprising:
applying said method after a detecting a demand trigger signal.

7. The method according to claim 6, wherein said demand trigger is set responsive to a read scrubbing trigger event.

8. The method according to claim 1, said reading of said at least one memory page between said first programming pass and said second programming pass is performed right after said first programming pass.

9. The method according to claim 1, said reading of said at least one memory page between said first programming pass and said second programming pass is performed right before said second programming pass.

10. The method according to claim 1, wherein said multilevel NAND flash memory comprises memory cells capable of storing at least 2 bits per cell.

11. A controller for managing programming errors in a multilevel NAND flash memory, said multilevel NAND flash memory using a two-pass programming algorithm for programming a memory block, said memory block being organized in pages, wherein said two-pass program algorithm comprises a first programming pass and a second programming pass over said memory pages that share a word line, said controller comprising:
a first programming unit adapted for performing said first programming pass for at least one memory page;
a reading unit adapted for reading said at least one memory page between said first programming pass and said second programming pass;
a determination module adapted for determining an error count value for said at least one programmed memory page; and
wherein said determination module is also adapted for:
responsive determining that said error count value is not below said threshold value, performing said second programming pass with non-active data.

12. The controller according to claim 11, wherein said determination module is also adapted for:
responsive to determining that said error count value is below a threshold value, performing said second programming pass for a programming with active data.

13. The controller according to claim 12, wherein said non-active data are random bit patterns.

14. The controller according to claim 11, wherein said determination module is also adapted for:
responsive to determining that said error count value is not below said threshold value, skipping said second programming pass.

15. The controller according to claim 11, also comprising:
a counter module adapted for activating said two-pass programming algorithm periodically every predetermined number of programming cycles of said memory block.

16. The controller according to claim 11, also comprising:
a determination unit adapted for determining a demand trigger signal and activating an application of said two-pass programming algorithm only after a detection of said demand trigger signal.

17. The method according to claim 16, wherein said demand trigger signal is set upon a read scrubbing trigger event.

18. The method according to claim 11, said reading unit is adapted for reading of said at least one memory page between said first programming pass and said second programming pass is performed right after said first programming pass, or
the reading unit is adapted for said reading of said at least one memory page between said first programming pass and said second programming pass is performed right before said second programming pass.

19. The method according to claim 11, wherein said multilevel NAND flash memory comprises memory cells capable of storing at least 2 bits per cell.

20. A computer program product for managing programming errors in a multilevel NAND flash memory, said multilevel NAND flash memory using a two-pass programming algorithm for programming a memory block, said memory block being organized in pages, wherein said two-pass program algorithm comprises a first programming pass and a second programming pass over said memory pages that share a word line, said computer program product comprising a computer readable storage medium having program instructions embodied therewith, said program instructions being executable by one or more computing systems or controllers to cause said one or more computing systems or controllers to:
perform said first programming pass for at least one memory page;
read said at least one memory page between said first programming pass and said second programming pass;
determine an error count value for said at least one programmed memory page; and
upon determining that said error count value is not below said threshold value, perform said second programming pass with non-active data.

* * * * *